(12) United States Patent
Gaudiana et al.

(10) Patent No.: US 7,544,747 B2
(45) Date of Patent: *Jun. 9, 2009

(54) PHOTOACTIVE MATERIALS AND RELATED COMPOUNDS, DEVICES, AND METHODS

(75) Inventors: Russell Gaudiana, Merrimack, NH (US); Savvas Hadjikyriacou, Tyngsboro, MA (US); David Waller, Lexington, MA (US); Zhengguo Zhu, Chelmsford, MA (US)

(73) Assignee: Konarka Technologies, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/952,577

(22) Filed: Dec. 7, 2007

(65) Prior Publication Data

US 2008/0105852 A1    May 8, 2008

Related U.S. Application Data

(63) Continuation of application No. 11/141,979, filed on Jun. 1, 2005, now Pat. No. 7,329,709.

(60) Provisional application No. 60/576,033, filed on Jun. 2, 2004.

(51) Int. Cl.
 C08G 65/04 (2006.01)
 C08L 71/02 (2006.01)
(52) U.S. Cl. ............... 525/445; 525/403; 525/409; 525/410; 977/737; 977/745; 977/778
(58) Field of Classification Search ......... 525/445, 525/403, 409, 410; 977/737, 745, 778
See application file for complete search history.

(56) References Cited

U.S. PATENT DOCUMENTS

| 7,329,709 B2 * | 2/2008 | Gaudiana et al. ............ 525/403 |
| 2002/0197521 A1 * | 12/2002 | Hinokuma et al. ............ 429/33 |
| 2004/0071624 A1 * | 4/2004 | Tour et al. ................. 423/447.1 |
| 2005/0279399 A1 * | 12/2005 | Gaudiana et al. ............ 136/243 |

FOREIGN PATENT DOCUMENTS

WO    WO02060812 A2    8/2002

OTHER PUBLICATIONS

Chen et al., "Polymer Photovoltaic Devices from Stratified Multilayers of Donor—Acceptor Blends," Adv. Mater. 12(18):1367-1370 (2000).

Drees et al., "Stabilization of the nanomorphology of polymer-fullerene "bulk heterojunction" blends using a novel polymerizable fullerene derivative," J. Mater. Chem. 15:5158-5163 (2005).

(Continued)

Primary Examiner—Randy Gulakowski
Assistant Examiner—Alicia M Toscano
(74) Attorney, Agent, or Firm—Fish & Richardson P.C.

(57) ABSTRACT

The present invention relates to fullerene derivatives including a pendant group that may be reacted to prepare a composition including a plurality of covalently bound fullerenes. The pendant group may be a cyclic ether, such as an epoxide. The present invention also relates to compositions including reaction products of these fullerene derivatives and photovoltaic devices including such polymeric compositions.

36 Claims, 6 Drawing Sheets

OTHER PUBLICATIONS

Nava et al., "Fullerene-functionalized polyesters: sunthesis, characterization and incorporation in photovoltaic cells," New J. Chem. 26:1584-1589 (2002).

Okamura et al., "Preparation of water-soluble pollulans bearing pendant C60 and their aqueous solubility," Macromol. Rapid. Commun., 20, 41-45, (1999).

Shaheen et al., "2.5% efficient organic plastic solar cells," Appl. Phys. Lett. 78(6):841-843 (2001).

Shi et al., A polyester and polyurethane of Diphenyl C61, retention of fulleroid properties in a polymer, J. Am. Chem.. Soc., 114, 10656-10657, (1992).

Tseng et al., "Functionalizing carbon nanotubes by plasma modification for the preparation of covlalent-interated epoxy compositions," Chem. Mater., 19, 308-315 (2007).

Yu et al., "Polymer Photovoltaic Cells: Enhanced Efficiencies via a Network of Internal Donor-Acceptor Heterojunctions," Science 270:1789-1791 (1995).

Zhang et al., "Soluble polythiophenes with pendane fullerene groups as double cable materials for photodiodes," Adv. Mater., 13, 24, 2871 (2001).

Zhu et al., "Stabilization of Film Morphology in Polymer-Fullerene Heterojunction Solar Cells," J. Macromol. Sc. 41(12):1467-1487 (2004).

* cited by examiner

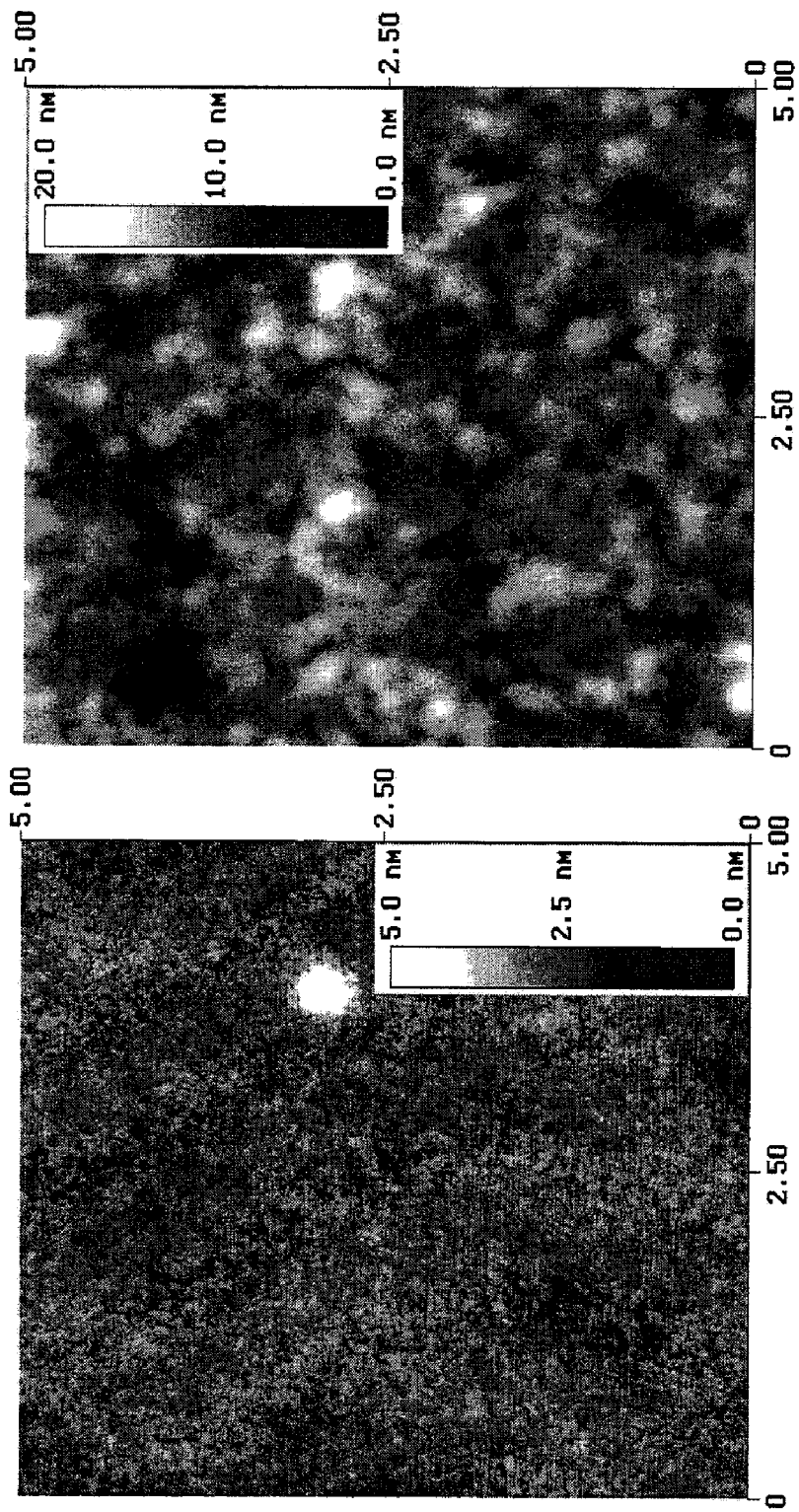

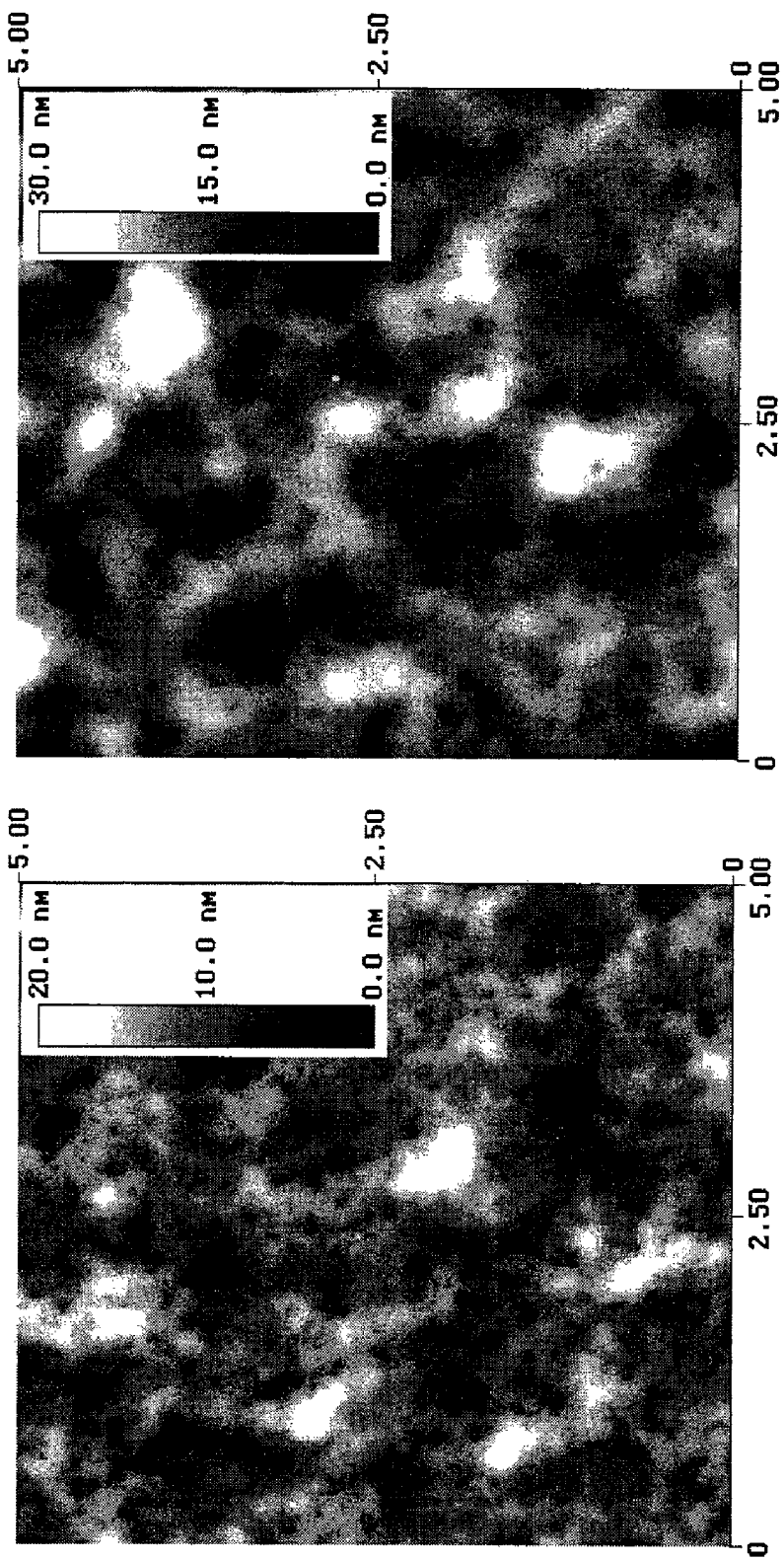

PHOTOACTIVE MATERIALS AND RELATED COMPOUNDS, DEVICES, AND METHODS

CROSS REFERENCE TO RELATED APPLICATIONS

This application is a continuation of and claims priority under 35 U.S.C. §120 to U.S. application Ser. No. 11/141,979, filed Jun. 1, 2005 now U.S. Pat. No. 7,329,709, which in turn claims priority under 35 U.S.C. § 119 to U.S. Provisional Application Ser. No. 60/576,033, filed Jun. 2, 2004. The entire contents of the parent applications are incorporated herein by reference.

FIELD OF THE INVENTION

The present application relates to photoactive materials, compounds for preparing photoactive materials, and devices including photoactive materials.

BACKGROUND

Polymeric photovoltaic devices may be used to convert solar energy to electrical energy. Such devices may be fabricated from organic materials including an electron donor and an electron acceptor.

SUMMARY

One aspect of the present invention relates to a fullerene derivative including a pendant cyclic ether. The pendant cyclic ether may include a cyclic group having a number Nc carbon atoms and a number No oxygen atoms, wherein Nc is at least 2 and No is at least 1. In certain embodiments, the number Nc is 2, 3, or 4 and No is 1.

The pendant cyclic ether may be, e.g., an epoxy, an oxetane, a furan, cyclopentene oxide, cyclohexene oxide, or a derivative thereof.

The pendant cyclic ether and the fullerene may be spaced apart by at least 1 carbon atom, e.g., at least 3 carbon atoms.

In some embodiments, the fullerene derivative is C61-phenyl-butyric acid glycidol ester or a derivative thereof.

Another aspect of the invention relates to a composition including a reaction product of a plurality of fullerene derivatives, each fullerene derivative including a pendant cyclic ether.

In some embodiments, the reaction product is an oligomer including at least two pendant fullerenes. In some embodiments, the reaction product is a polymer including a plurality of repeat units, e.g., 10 or more repeat units, each repeat unit including a pendant fullerene.

The composition may include a conducting polymer. The conducting polymer may include at least one of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes, polyphthalocyanines; polyvinylenes; or derivatives thereof.

The mixture of which the composition is the reaction product of may include the plurality of fullerene derivatives and at least one conducting polymer or precursor thereof. The at least one of the conducting polymer or precursor thereof may include a cyclic ether configured to react with the pendant cyclic ether of the fullerene derivatives and/or the cyclic ether of other of the conducting polymer or precursor thereof. The conducting polymer or precursor thereof may include polythiophene or a derivative thereof. The mixture may include a solvent.

The pendant cyclic ether of the fullerene derivative may include a cyclic group having a number Nc carbon atoms and a number No oxygen atoms, wherein Nc is at least 2 and No is at least 1. In certain embodiments, the number Nc is 2, 3, or 4 and No is 1. The pendant cyclic ether may be, e.g., an epoxy, an oxetane, a furan, cyclopentene oxide, cyclohexene oxide, or a derivative thereof. The pendant cyclic ether and the fullerene may be spaced apart by at least 1 carbon atom, e.g., at least 3 carbon atoms. The pendant cyclic ether and the fullerene may be spaced apart by a linking group including an ester group alone or in combination with other groups such as 1 or more carbon atoms.

Another aspect of the invention relates to a method for preparing a composition. A mixture including a plurality of fullerene derivatives each including at least one pendant cyclic ether is subjected to conditions sufficient to react the pendant cyclic ether of each of the plurality of fullerene derivatives to prepare a composition comprising at least two pendant fullerenes.

The composition may be an oligomer including at least two pendant fullerenes. The composition may be a polymer comprising a plurality of repeat units, each repeat unit comprising at least one pendant fullerene. Reacting the pendant cyclic ether of each of the plurality of fullerene derivatives may form a polymeric chain comprising a plurality of ether groups and a plurality of pendant fullerenes.

In some embodiments, the mixture includes at least one of a conducting polymer or a precursor of a conducting polymer. The mixture may include at least one of a polythiophene, or derivative thereof. The conducting polymer or precursor thereof may include a cyclic ether configured to react with the pendant cyclic ether of the fullerene derivatives and/or the cyclic ether of other of the conducting polymer or precursor thereof.

Another aspect of the invention relates to a method of preparing a photovoltaic device. A first surface is contacted with a mixture including a plurality of fullerene derivatives, each fullerene derivative including a pendant cyclic ether and an electron donor. The pendant cyclic ethers of fullerene derivatives of the mixture are reacted to prepare a composition comprising a plurality of covalently bound pendant fullerenes. The composition is contacted with a second surface.

The composition may be an oligomer including at least two pendant fullerenes. The composition may be a polymer including a plurality of repeat units, e.g., 10 or more repeat units, each repeat unit including at least one pendant fullerene.

Another aspect of the invention relates to a method of preparing a photovoltaic device. A first surface is contacted with a mixture including a plurality of fullerene derivatives, each fullerene derivative including a pendant cyclic ether and an electron donor. The pendant cyclic ethers of fullerene derivatives of the mixture are reacted to prepare a composition including a plurality of covalently bound pendant fullerenes. The mixture is contacted with a second surface.

Another aspect of the invention relates to a photovoltaic device including a first electrode, a second electrode, and a photoactive layer between the first and second electrodes. The photoactive layer includes a composition including a plurality of fullerene derivatives, each fullerene derivative including a pendant cyclic ether, and an electron donor.

Another aspect of the invention relates to a photovoltaic device including a first electrode, a second electrode, and a photoactive layer between the first and second electrodes. The photoactive layer includes a reaction product of a plurality of fullerene derivatives, each fullerene derivative including a pendant cyclic ether, and an electron donor.

In some embodiments, the invention features a module including a plurality of photovoltaic devices.

Another aspect of the invention relates to a fullerene derivative of the general formula F—$R_1$—$R_2$, wherein F is a fullerene, $R_1$ includes at least one atom, and $R_2$ comprises a cyclic ether. $R_2$ may be an epoxy, oxetane, epoxide, a furan, cyclohexene oxide, cyclopentene oxide, or derivative thereof.

Another aspect of the invention relates to a fullerene derivative including a reactive moiety configured to react with reactive moieties of other fullerene derivatives to provide a reaction product including a substantially non-conjugated oligomeric or polymeric component including a plurality of pendant fullerenes.

The reactive moiety may be configured to react with reactive moieties of other fullerene derivatives to provide a reaction product including a substantially non-conjugated oligomeric or polymeric component comprising a plurality of pendant fullerenes, the other fullerene derivatives comprising identical reactive moieties.

Another aspect of the invention relates to a composition including a substantially non-conjugated component including a plurality of pendant fullerenes, wherein the component is an oligomer or a polymer and a conducting polymer.

The non-conjugated component may include a plurality of ether groups. In some embodiments, the pendant fullerenes and the conducting polymer are not covalently linked.

In another aspect, the invention relates to a composition including a substantially non-conjugated component having a plurality of pendant fullerenes. The composition may be an oligomeric composition or a polymeric composition.

BRIEF DESCRIPTION OF THE DRAWINGS

FIG. 6a is an AFM image of an unheated PCBM:P3HT film;
FIG. 6b is an AFM image of the film of FIG. 6a after heating for 5 minutes at 120° C.;
FIG. 7b is an AFM image of the film of FIG. 7a;
FIG. 8a is an AFM scans of a PCBG:P3HT film heated at 140° C. for 4 minutes;
and
FIG. 8b is an AFM scan of the film of FIG. 8a heated at 140° C. for 1 hour.

DETAILED DESCRIPTION

Figure 1:
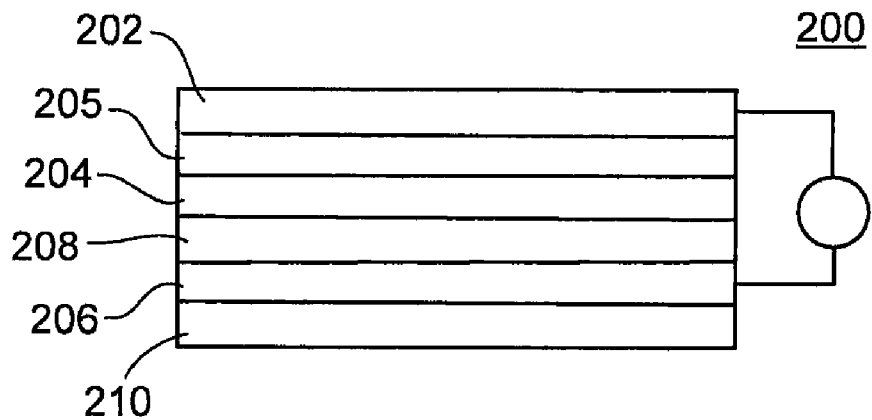
FIG. 1 is an embodiment of a photovoltaic device.

Referring to FIG. 1, a photovoltaic device 200 includes a first electrode 202, e.g., an anode, a photoactive layer 204, and a second electrode 206, e.g., a cathode. A hole carrier layer 208 including a conductive polymer is disposed intermediate the photoactive layer 204 and the second conductor 206. An optional hole blocking layer 205 is disposed between photoactive layer 204 and first electrode 202. Device 200 includes a substrate 210, e.g., a light transmissive layer, abutting an outer surface of second electrode 206.

Device 200 may be used to convert energy in the form of light to electrical energy. In a typical configuration, light interacts with photoactive layer 204, which generally includes an electron donor material and an electron acceptor material. Electrons are transferred from the electron donor material to the electron acceptor material. The electron acceptor material transmits the electrons through hole blocking layer 205 to first electrode 202. The electron donor material transfers holes through hole carrier layer 208 to second electrode 206. First and second electrodes 204, 208 are electrically connected via an external load so that electrons pass from second electrode 208 to first electrode 202.

Electron acceptor materials of photoactive layer 204 generally include fullerenes. Exemplary electron donor materials include polythiophene and derivatives thereof, e.g., poly(3-hexylthiophene).

Compositions including electron acceptor materials and/or electron donor materials as well as related compounds, devices, and methods are discussed below.

Figure 2:
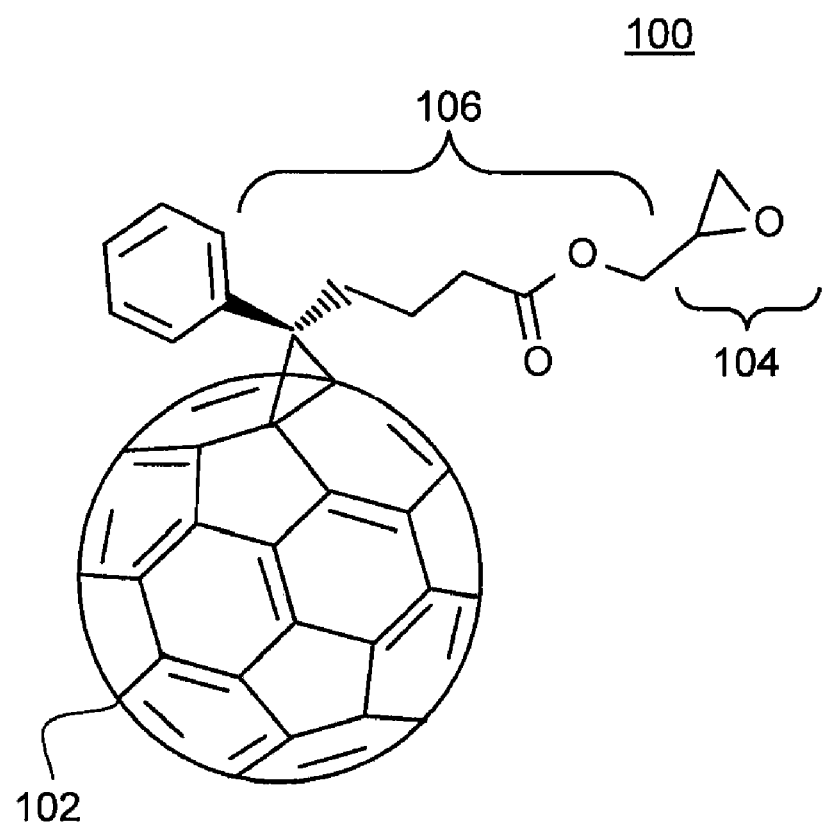
FIG. 2 is a fullerene derivative.

Referring to FIG. 2, a fullerene derivative 100 includes a fullerene 102, a pendant group 104, e.g., a cyclic ether such as epoxy, oxetane, or furan, and a linking group 106 that spaces the pendant group apart from the fullerene. In the embodiment shown, fullerene derivative 100 is $C_{61}$-phenyl-butyric acid glycidol ester (PCBG). Pendant group 104 is generally sufficiently reactive that fullerene derivative 100 may be reacted with another compound, e.g., another fullerene derivative, to prepare a reaction product including fullerene 102 or a derivative thereof.

Figure 3:
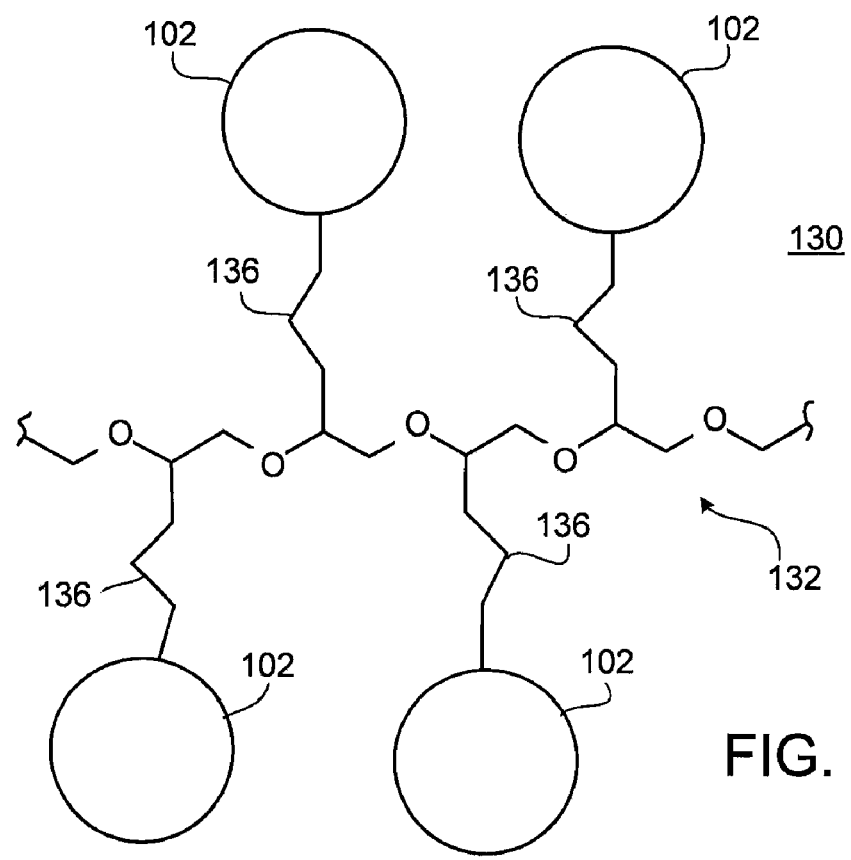
FIG. 3 is a composition including a plurality of fullerenes.

Referring to FIG. 3, a composition 130 includes a chain 132 having a plurality of pendant fullerenes 102, each connected to chain 132 by a linking group 136. Linking group 136 includes at least 1 atom, at least 2 atoms, e.g., at least 3 atoms that space the fullerene and pendant group apart. Linking group 136 may be identical with or different from linking group 106. In certain embodiments, linking group 136 includes a portion formed by the reaction of pendant group 104 of one or more fullerene derivatives. Respective fullerenes 102 have linking groups that may be the same or different.

Composition 130 may be a reaction product of a mixture including fullerene derivative 100. Although the pendant fullerenes of composition 130 are shown to be the same, compositions comprising pendant fullerenes may include a plurality of different pendant fullerenes.

Figure 4:
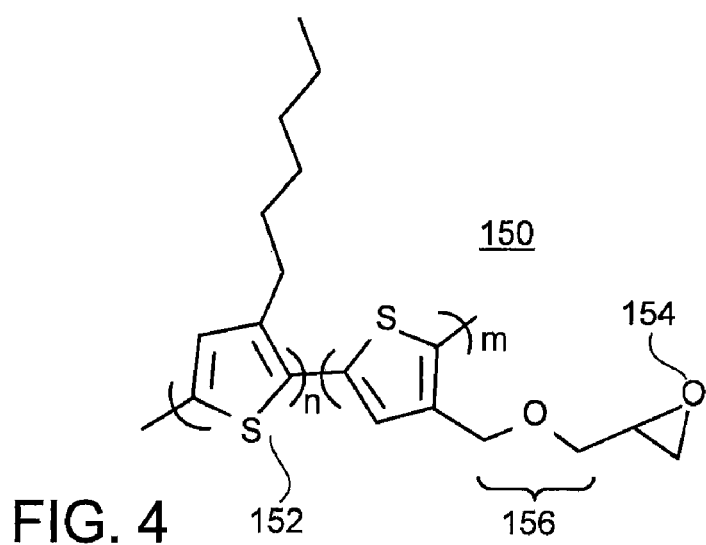
FIG. 4 is a derivatized electron donor.

Referring to FIG. 4, a derivatized electron donor 150 includes an electron donor, e.g., a thiophene component 152, a pendant group 154, e.g., a cyclic ether such as epoxy, oxetane, furan, cyclopentene oxide, cyclohexene oxide, or a derivative thereof, and a linking group 156 that spaces the pendant group apart from the thiophene component. Pendant group 154 is generally sufficiently reactive that derivatized electron donor 150 may be reacted with another compound, e.g., another derivatized electron donor and/or a fullerene derivative, to prepare a reaction product of electron donor 150 and/or fullerene 102.

Figure 5:
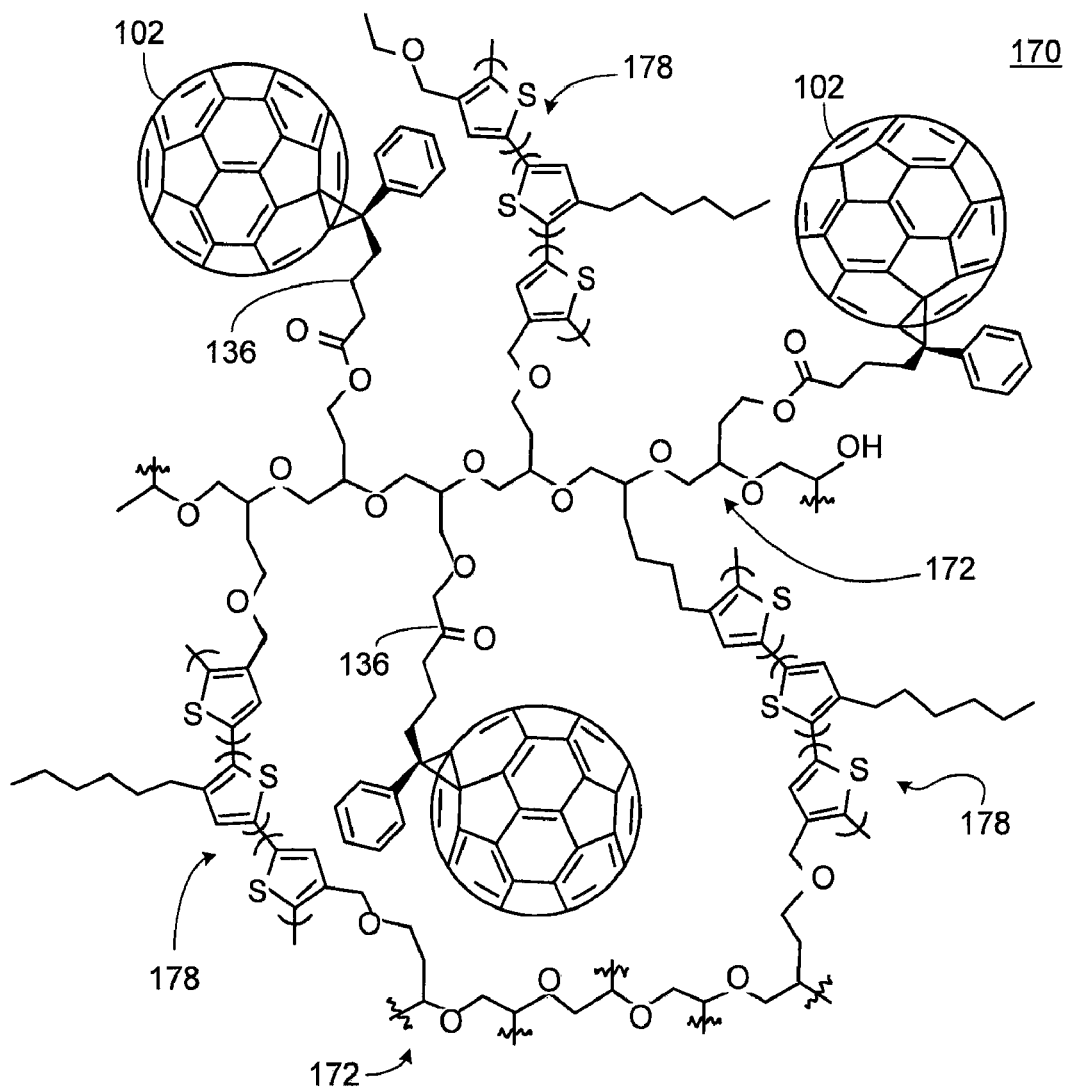
FIG. 5 is a composition including a plurality of fullerenes and an electron donor component.

Referring to FIG. 5, a composition 170 includes a plurality of chains 172 each including a plurality of pendant fullerenes 102. Each pendant fullerene is connected to a respective chain 172 by linking group 136. Chains 172 are cross-linked by groups 178, which include a reaction product of derivatized electron donor 150. Composition 170 may be a reaction product of a mixture including fullerene derivative 100, derivatized electron donor 150, and, optionally, a solvent and/or an initiator, such as, for example, an acid, e.g., a Lewis acid. As shown, pendant group 104 of fullerene derivative 100 may react with pendant group 154 of derivatized electron donor 150 and with pendant groups 134 of other fullerene derivatives.

Fullerenes

As used herein, the term "fullerene" means a compound, e.g., a molecule, including a three-dimensional carbon skeleton having a plurality of carbon atoms. The carbon skeleton of such fullerenes generally forms a closed shell, which may be, e.g., spherical or semi-spherical in shape. Alternatively, the carbon skeleton may form an incompletely closed shell, such as, e.g., a tubular shape. Carbon atoms of fullerenes are generally linked to three nearest neighbors in a tetrahedral network.

Fullerenes may be designated as $C_j$, where j is an integer related to the number of carbon atoms of the carbon skeleton. For example, $C_{60}$ defines a truncated icosahedron including 32 faces, of which 12 are pentagonal and 20 are hexagonal. Other suitable fullerenes include, e.g., $C_j$ where j may be at least 50 and may be less than about 250.

Fullerenes are generally produced by the high temperature reaction of a carbon source, such as elemental carbon or carbon containing species. For example, sufficiently high temperatures may be created using laser vaporization, an electric arc, or a flame. Subjecting a carbon source to high temperatures forms a carbonaceous deposit from which various fullerenes are obtained. Typically, the fullerenes are obtained using a combination of solvent extraction and chromatography.

Pendant and Linking Groups

As used herein, the term "pendant group" means a group covalently bound by a linking group to another compound, e.g., to a fullerene or an electron donor component. The pendant group may comprise a cyclic ether, e.g., an epoxy, a furan, an oxetane, cyclohexene oxide, cyclopentene oxide, or derivatives of such groups. Exemplary cyclic ethers include a cyclic group having a number Nc carbon atoms and a number No oxygen atoms, wherein Nc is at least 2 and is typically 6 or less, and No is generally 1 and is typically 3 or less. In certain embodiments, Nc is 2, 3, or 4 and No is 1.

The linking group spaces the pendant group apart from the other compound, e.g., the fullerene or the electron donor component, by at least one atom, e.g., at least two atoms, such as at least three atoms. At least one atom of the linking group may be a carbon atom. As seen in FIG. 2, linking group 106 spaces pendant group 104 apart from fullerene 102 by 7 atoms. Of these 7 atoms, 6 are carbon atoms and one is an oxygen atom. Linking group 106 also includes a phenyl group, the benzene ring of which does not space pendant group 104 apart from fullerene 102.

Exemplary linking groups include hydrocarbons, e.g., aliphatic (e.g., alkyl or alkenyl) groups, alicyclic (e.g., cycloalkyl, cycloalkenyl) groups, acyl groups, phenyl groups, substituted aromatic groups, substituted aliphatic groups, halogenated groups, e.g., fluorocarbons, and alicyclic-substituted aromatics. The linking group may include one or more heteroatoms, e.g., sulfur, oxygen, nitrogen, or combination thereof. Accordingly, the linking group may include, e.g., an alcohol, an ether, an ester, an aldehyde, an acid, a ketone or combination thereof.

The linking group may be linear or branched. A linking group may link more than one group pendant with respect to the fullerene.

Some linking groups and/or the pendant groups enhance the solubility of the fullerene derivative as compared to the underivatized fullerene missing the linking group and/or pendant group.

Compositions, e.g., composition 130 and composition 170, may include pendant fullerenes (FIGS. 3 and 5) that are covalently linked to another portion of the composition, e.g., a chain thereof. The linking group linking the fullerene to other portions of the composition may have any or all properties of the linking groups of fullerene derivatives and derivatized electron donors referred to herein.

Electron Donors

Electron donors are compounds that may be used to prepare a conducting composition, e.g., a conducting polymer. Conducting compositions generally include a conjugated portion, e.g., a conjugated organic polymer. Conjugated polymers are characterized in that they have overlapping π orbitals, which contribute to the conductive properties. Conjugated polymers may also be characterized in that they can assume two or more resonance structures. The conjugated organic polymer may be, e.g., linear or branched, so long as the polymer retains its conjugated nature.

Examples of suitable conjugated organic polymers include one or more of polyacetylene; polyphenylenes; poly-(3-hexylthiophene); polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polyphenylvinylenes; polysilanes; polyisothianaphthalenes; polythienylvinylenes; derivatives of any of these materials and combinations thereof.

Exemplary derivatives of these materials include derivatives having pendant groups, e.g., a cyclic ether, such as epoxy, oxetane, furan, or cyclohexene oxide. Derivatives of these materials may alternatively or additionally include other substituents. For example, thiophene components of electron donor may include a phenyl group, such as at the 3 position of each thiophene moiety. As another example, alkyl, alkoxy, cyano, amino, and/or hydroxy substituent groups may be present in any of the polyphenylacetylene, polydiphenylacetylene, polythiophene, and poly(p-phenylene vinylene) conjugated polymers.

Oligomeric and Polymeric Compositions

As discussed above, typical compositions include one or more fullerenes. The compositions are generally oligomeric, polymeric, or a combination thereof. Oligomeric compositions include at least two fullerenes covalently linked by linking groups. Polymeric compositions include a plurality of repeat units, e.g., more than 10 repeat units or more than 20 repeat units. Many or all of the repeat units may include a pendant fullerene covalently bound to the repeat unit by a linking group.

Returning to FIG. 3, fullerene derivatives 100 of composition 130 are linked to chain 132, which includes a plurality of ether groups. Chain 132 limits or prevents the fullerene component of composition 130 from clustering in phase domains that separate from other components that composition 130 may include. Such other components may include electron donors, as discussed below. In certain embodiments, e.g., FIG. 3, chain 132 is substantially non-conducting, i.e., the chain 132 to which the fullerenes 102 are connected is insufficiently conductive to itself serve as an electron donor in a photovoltaic device. Composition 130 may be the reaction product of a mixture comprising a plurality of fullerene derivatives 100.

Composition 170 includes an electron donor and a fullerene (FIG. 5). Fullerene 102 is covalently linked to groups 178, which are conjugated and may serve as electron donors. This is in contrast to composition 130 in which the fullerene component 102 is not covalently linked to a conjugated compound or a compound that may serve as an electron donor. It is not necessary for a fullerene component and electron donor component of a composition to be covalently linked.

Compositions may be prepared from a mixture that includes a fullerene derivative and, optionally, an electron donor component. The mixture may include one or more of a solvent and an initiator, such as, for example, an acid, e.g., a Lewis acid. Suitable solvents include organic liquids, such as halogenated organic liquids, e.g., tetrachloroethylene. The electron donor component used to prepare the composition may be derivatized so that the resulting composition includes fullerenes covalently linked to reaction products of the electron donor as in composition 170. Alternatively, or in combination, the electron donor may be free of groups that result in a reaction product including covalently linked fullerene and electron donor reaction products.

A composition may be prepared from a mixture including a fullerene derivative and an electron donor. Typically, the amount by weight of fullerene derivative relative to the total weight of the fullerene derivative and the electron donor is at least 10%, at least 20%, e.g., at least about 30%. The amount by weight of fullerene derivative relative to the total weight of the fullerene derivative and the electron donor may be less than about 90%, less than about 80%, e.g., less than about 70%. In certain embodiments, the fullerene and electron donor are present in a 2:1 ratio by weight. The mixture may also include a solvent, e.g., tetrachloroethylene. The fullerene derivative may be PCBG. The electron donor may be P3HT.

An amount of initiator may be present in the mixture used to prepare the composition. Typically, the initiator is present in an amount of less than about 5% by weight of the total weight of the initiator, fullerene derivative, and electron donor, less than about 1%, e.g., less than about 0.05%. Whether or not an initiator is present, reaction of the pendant group of the fullerene derivative (and of the pendant group of the electron donor if derivatized) may be thermally initiated, such as by heating the mixture to about 100° C., e.g., at least about 120° C., for at least about 30 seconds, at least about 2.5 minutes, e.g., at least about 15 minutes.

Other electron acceptor materials include, e.g., discotic liquid crystals, inorganic nanoparticles (e.g., nanoparticles including zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers including moieties capable of accepting electrons or forming stable anions (e.g., polymers containing CN groups, polymers containing nitro groups $NO_2$, oxadiazoles, polymers containing $CF_3$ groups).

Photovoltaic Devices

Returning to FIG. 1, device 200 is configured such that light impinges upon and passes through substrate 210, second electrode 206, hole carrier layer 208, and into photoactive layer 204. Thus, substrate 210 transmits light and is typically formed of a transparent material. As referred to herein, a transparent material is a material, which, at the thickness used in a photovoltaic cell 200, transmits at least about 60% (e.g., at least about 70%, at least about 75%, at least about 80%, at least about 85%) of incident light at a wavelength or a range of wavelengths used during operation of the photovoltaic cell. An exemplary wavelength or range of wavelengths occurs between about 300 nanometers and about 850 nanometers.

Exemplary materials from which substrate 210 can be formed include polyethylene terephthalates, polyimides, polyethylene naphthalates, polymeric hydrocarbons, cellulosic polymers, polycarbonates, polyamides, polyethers, polyether ketones, and derivatives thereof including copolymers of such materials. In certain embodiments, the polymer can be a fluorocarbon, e.g., a fluorocarbon ether. In some embodiments, combinations of polymeric materials are used. In certain embodiments, different regions of substrate 210 can be formed of different materials.

In general, substrate 210 can be flexible, semi-rigid or rigid (e.g., glass). In some embodiments, substrate 210 has a flexural modulus of less than about 5,000 megaPascals. In certain embodiments, different regions of substrate 210 can be flexible, semi-rigid or inflexible (e.g., one or more regions flexible and one or more different regions semi-rigid, one or more regions flexible and one or more different regions inflexible).

Typically, substrate 210 is at least about one micron (e.g., at least about five microns, at least about 10 microns) thick and/or at most about 1,000 microns (e.g., at most about 500 microns thick, at most about 300 microns thick, at most about 200 microns thick, at most about 100 microns, at most about 50 microns) thick.

Generally, substrate 210 can be colored or non-colored. In some embodiments, one or more portions of substrate 210 is/are colored while one or more different portions of substrate 210 is/are non-colored.

Substrate 210 can have one planar surface (e.g., the surface on which light impinges), two planar surfaces (e.g., the surface on which light impinges and the opposite surface), or no planar surfaces. A non-planar surface of substrate 210 can, for example, be curved or stepped. In some embodiments, a non-planar surface of substrate 210 is patterned (e.g., having patterned steps to form a Fresnel lens, a lenticular lens or a lenticular prism).

Either or both of first and second electrodes 202, 206 may be configured to transmit at least a portion of light impinging thereon. For example, at least one of electrodes 202, 206 may be formed of a transmissive material. An exemplary transmissive material includes a transmissive oxide, such as a tin oxide, e.g., indium-doped tin oxide (ITO). As an alternative to or in conjunction with a transmissive material, electrode 206 may be configured with open areas to allow light to pass through and closed areas defined by a conductive material that conducts electrons. In one embodiment, at least one of electrodes 202, 206 is a mesh. Generally, electrodes 202, 206 are formed of different materials.

Hole carrier layer 208 is generally formed of a material that, at the thickness used in photovoltaic cell 200, transports holes to electrode 206 and substantially blocks the transport of electrons to electrode 206. Examples of materials from which layer 206 can be formed include polythiophenes (e.g., PEDOT), polyanilines, polyvinylcarbazoles, polyphenylenes, polyphenylvinylenes, polysilanes, polythienylenevinylenes and/or polyisothianaphthanenes. In some embodiments, hole carrier layer 208 can include combinations of hole carrier materials.

In general, the distance between the upper surface of hole carrier layer 208 (i.e., the surface of hole carrier layer 208 in contact with photoactive layer 204) and the upper surface of electrode 206 (i.e., the surface of electrode 206 in contact with hole carrier layer 208) can be varied as desired. Typically, the distance between the upper surface of hole carrier layer 208 and the upper surface of electrode 206 is at least 0.01 micron (e.g., at least about 0.05 micron, at least about 0.1 micron, at least about 0.2 micron, at least about 0.3 micron, at least about 0.5 micron) and/or at most about five microns (e.g., at most about three microns, at most about two microns, at most about one micron). In some embodiments, the distance between the upper surface of layer 208 and the upper surface of electrode 206 is from about 0.01 micron to about 0.5 micron.

Photoactive layer 204 may include, e.g., one or more compositions discussed herein. For example, photoactive layer 204 generally includes a fullerene component, e.g., a fullerene derivative, an oligomeric composition including fullerenes, a polymeric composition including fullerenes, a reaction product of mixtures including fullerene derivatives, or a combination thereof. Photoactive layer 204 may also include an electron donor material including, e.g., thiophene, polythiophene, thiophene derivatives, polythiophene derivatives, reaction products of mixtures including one or more of these materials, or combinations thereof. Photoactive layer 204 may include other electron acceptor and electron donor materials, such as those discussed elsewhere herein. In some embodiments, the electron donor material is poly(3-hexylthiophene).

Generally, photoactive layer 204 is sufficiently thick to be relatively efficient at absorbing photons impinging thereon to form corresponding electrons and holes, and sufficiently thin to be relatively efficient at transporting the holes and electrons to electrodes of the device. In certain embodiments, layer 204 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, layer 204 is from about 0.1 micron to about 0.2 micron thick.

Hole blocking layer 205 is general formed of a material that, at the thickness used in photovoltaic cell 200, transports electrons to first electrode 202 and substantially blocks the transport of holes to electrode 206. Examples of materials from which layer 205 can be formed include LiF and metal oxides (e.g., zinc oxide, titanium oxide).

Typically, hole blocking layer 205 is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

In some embodiments, a photovoltaic device can be prepared as follows. Electrode 206 is formed upon substrate 210 using conventional techniques. Electrode 206 is configured to allow an electrical connection to be made with an external load. Layer 208 is formed upon electrode 206 (e.g., using a solution coating process, such as slot coating, spin coating or gravure coating). Photoactive layer 204 is formed upon layer 208 preferably using a solution coating process. Electrode 202 is formed upon photoactive layer 204 (e.g., using a vacuum coating process, such as evaporation or sputtering).

The photovoltaic devices and modules including the photovoltaic devices can generally be used as a component in any intended system. Examples of such systems include roofing, package labeling, battery chargers, sensors, window shades and blinds, awnings, opaque or semitransparent windows, and exterior wall panels.

The following examples are illustrative and not intended to be limiting.

EXAMPLES

As discussed in the following examples, fullerene derivatives have been prepared and used to prepare compositions including fullerenes. Photovoltaic devices including such compositions have been prepared.

Synthesis of PCBG

Precursors suitable for preparation of fullerene derivatives were prepared. First, methyl 4-benzoylbutyrate was prepared as follows. A solution of 4-benzoylbutyric acid (11.9 g, 0.0619 mol) in MeOH (250 ml) with a catalytic amount of sulfuric acid (96%, 6 drops) was refluxed for 5 hours. Solvent was removed and 50 ml water was added. The reaction product was extracted with dichloromethane to provide an organic layer. The organic layer was separated, dried over $MgSO_4$ and passed through a plug of silica, which was rinsed with 2% acetone in dichloromethane. Solvent was removed to afford the methyl ester as light-yellowish oil (12.57 g, 99%).

Next, methyl 4-benzoylbutyrate p-tosylhydrazone was prepared as follows. A mixture of methyl 4-benzoylbutyrate (12.69 g, 0.0616 mole), p-toluene-sulfonyl hydrazide (13.7 g, 0.0736 mole), and MeOH (45 mL) was stirred and refluxed for 7 hours to prepare a reaction mixture. The reaction mixture was allowed to cool to room temperature when crystals started to form. The reaction flask was stored in a refrigerator overnight and the crystalline product was collected by filtration, washed with a small amount of cold MeOH, and dried to afford the tosylhydrazone 21.5 g (93%) as white crystals.

A fullerene derivative, 1-(3-(Methoxycarbonyl)propyl)-1-phenyl-C61 (PCBM) was synthesized as follows. Methyl 4-benzoylbutyrate p-tosylhydrazone (3.33 g, 8.89 mmol) was dissolved in 66 mL of dry pyridine in a dry three-neck flask flushed with $N_2$. NaOMe (500 mg, 9.26 mmol) was added to the flask to prepare a first mixture, which was stirred for 30 min at room temperature. A solution of 3.20 g (4.44 mmol) of C60 in 220 mL of dry 1,2-dichlorobenzene was added to prepare a second mixture, which was then stirred at 70° C. for 22 hours. The stirred second mixture was transferred to a round bottom flask and concentrated to 150 mL at a pressure of about 0.1 mm Hg. The concentrated solution was poured on a silica gel/toluene column (40×10 cm), pre-eluted with 200 mL of chlorobenzene. The concentrated solution was eluted with 450 mL of chlorobenzene and then with toluene. A fraction containing unreacted C60 (ca. 500 mg), was collected first. A fraction containing {6}-1-(3-(methoxycarbonyl)propyl)-(5)-1-phenyl[5.6]-C61 was collected. Solvent was removed to afford a dark brown solid. 1,2-Dichlorobenzene was added to the brown solid and the resulting mixture heated to reflux for 7 hours under nitrogen. The solvent was removed in vacuo and the resulting residue dissolved in dichloromethane (25 mL). Methanol was added and the resulting precipitates were collected by filtration and dried in vacuum to afford PCBM (1.85 g, 46%).

PCBM (1.00 g, 1.1 mmol) was dissolved in 1,2-dichlorobenzene to prepare a first mixture. Acetic acid, (100 ml) and concentrated hydrochloric acid (40 ml) were added to the first mixture to prepare a second mixture, which was then heated to reflux for 20 hours. Solvent was removed from the refluxed second mixture and the residue was suspended in methanol to form a third mixture.

Precipitates were collected from the third mixture by filtration and dried under vacuum. The precipitates included 0.94 g at 95% purity of the carboxylic acid. The carboxylic acid was suspended in dry carbon disulfide (300 ml) under nitrogen and thionyl chloride (300 ml) was added to prepare a fourth mixture. The fourth mixture was heated to reflux for 18 hours and volatile components were removed using a rotary evaporator leaving behind a second residue.

Dry toluene (100 ml), pyridine (4 ml), and glycidol (200 mg) were combined with the second residue to prepare a fifth mixture, which was then stirred at room temperature for 20 hours. After stirring, the solvents were removed leaving behind a third residue. The third residue was purified by flash chromatography using an initial solvent mixture of dichloromethane:hexane in a 1:4 ratio and ramping up to a 4:1 ratio to provide 203 mg PCBG. The yield was about 25% from the carboxylic acid and about 23% from PCBM.

Synthesis of Modified Polythiophenes

An acetoxy-functionalized thiophene derivative was prepared as follows. Ferric chloride (6.92 g, 42.5 mmoles) was dispersed in 70 mL chloroform in a three neck flask equipped with a condenser, $N_2$ inlet, and a magnetic stirrer. The dispersion was degassed by bubbling $N_2$ for 60 minutes. The $N_2$ was then supplied on the surface of the dispersion with stirring. Using a syringe, a monomer mixture including a solution of 2.50 g (12.7 mmoles) of 3-octylthiophene and 0.25 g (0.84 mmoles) of 3-(2-acetoxyethyl)thiophene in 10 mL chloroform was added dropwise.

After the addition of the monomer mixture, the system was stirred for 45 minutes. About 1.5 liters of methanol was added to precipitate a polymer. The precipitate was collected and subjected to sohxlet extraction for 24 hours to prepare a colorless extract.

Insoluble material from the extraction was dissolved in chloroform and reprecipitated in 1.5 L of methanol to which 6 mL of concentrated aqueous ammonia was added. The polymer was stirred in the ammoniacal methanol for 60 minutes and then filtered by suction filtration and dried under vacuum at room temperature overnight to yield 1.640 grams of polymer.

The polymer was analyzed by $^1$H NMR, which revealed that the polymer contained 11.6 mole percent of 3-(2-acetoxyethyl)thiophene. The presence of 3-(2-acetoxyethyl) thiophene in the polymer was also confirmed by FT-IR spectroscopy. The polymer had an absorption maximum at 440 nm in chloroform. The polymer had a Mn of 40000 and a Mw/Mn of 3.0.

A hydroxy-functionalized polythiophene was prepared as follows. The acetoxy-functionalized polythiophene prepared as above was dissolved (1.1 g) in 50 ml tetrahydrofuran in a flask equipped with a condenser and magnetic stirrer. A 50% aqueous NaOH solution (2.1 g) was added with stirring to prepare a mixture. The temperature of the mixture was raised to 65° C. and maintained for 4 hours. The mixture was then cooled to room temperature and the polymer was isolated by precipitation in 1.2 L of methanol. The precipitate (i.e., the copolymer poly[3-octylthiophene-co-3-(2-hydroxyethyl) thiophene) was isolated by suction filtration and dried under vacuum overnight.

The precipitated copolymer was characterized by FT-IR spectroscopy, which showed that the peak assigned to the carbonyl of the ester group completely disappeared. Thus, the hydrolysis is understood to be quantitative. The amount of copolymer isolated was 1.04 g.

A furan functionalized polythiophene (Furol-PT) was prepared as follows. The hydroxy-functionalized polymer prepared above was dissolved (0.3 g) in 20 ml anhydrous tetrahydrofuran in a reaction flask equipped with a condenser, $N_2$ inlet and a magnetic stirrer. Dry pyridine (6 ml) was added with stirring. The reaction flask was cooled to 0° C. in an ice bath. A solution of 1.5 ml furoyl chloride in 10 ml tetrahydrofuran was added dropwise by syringe to the cooled material in the reaction flask. The reaction flask was then maintained in the ice bath for one hour.

After one hour, the reaction flask was removed from the ice bath and allowed to warm to room temperature. The material in the flask was stirred at room temperature overnight to prepare a reaction mixture. The reaction mixture was poured in 1.2 liters of methanol to precipitate a polymer. The polymer was isolated by suction filtration and dried under vacuum at room temperature for 48 hours.

The dried isolated polymer was characterized by $^1$H NMR and FT-IR spectroscopies that confirmed its structure. Conversion of the hydroxyl groups was estimated by $^1$H NMR to be quantitative to give the furan functional polythiophene copolymer: poly[3-octylthiophene-co-3(-2-(2-furan carboxylate)ethyl)thiophene] (furoyl-PT).

Preparation of Films Including Photoactive Materials

A solution of PCBG:P3HT:tris(pentafluorophenyl)borane (TPFPB) (2:1:0.01 by weight) was prepared in tetrachloroethylene. A solution of PCBG:P3HT (2:1 by weight) was prepared in tetrachloroethylene. A solution of PCBM:P3HT (2:1 by weight) was prepared in tetrachloroethylene. A solution of PCBM:Furoyl-PT was prepared in tetrachloroehthylene with 1.4% triflic acid initiator. Films of each of these four solutions were prepared by spin coating the solution onto glass substrates. The films were heated to 120° C. for 2 hours.

The fullerene component of the PCBM solutions was non-crosslinkable as compared to the fullerene component of the PCBG solutions. The polythiophene component of the P3HT solutions was expected to be non-crosslinkable as compared to the polythiophene component of the furoyl-PT solution.

After heating, the noncrosslinkable (with respect to the fullerene component) PCBM:P3HT and PCBM:Furoyl-PT films were found to turn hazy while the PCBG:P3HT:TPFPB films remained clear. The PCBG:P3HT and PCBG:P3HT:TPFPB films remained free of haziness. The haziness of the heated PCBM:P3HT and PCBM:Furoyl-PT films indicate the presence of phase domains with a size on the order of or greater than the wavelength of visible light. The absence of haziness of the heated PCBG:P3HT:TPFPB and PCBG:P3HT films indicates the absence of such phase domains. This can be explained by the reduced molecular mobility of the fullerene component resulting from polymerization of the epoxy rings of each of a plurality of PCBG molecules.

Domain formation in the PCBM:Furoyl-PT films indicates that polymerization of the fullerene component is more important than crosslinking the other components of the photoactive medium. In the polymeric composition of the PCBM:furoyl-PT films, the fullerene component was not covalently linked to other portions of the composition.

The absence of domain formation in the PCBG:P3HT films, which lacked the initiator TPFPB demonstrates that thermally initiated polymerization of PCBG is sufficient, even in the absence of compounds that initiate polymerization of epoxy groups, to reduce phase separation of photoactive films including fullerenes.

Both the PCBM:P3HT and PCBG:P3HT films changed from an orange to a purple color upon heating. The color change is believed due to conformational changes possibly relating to stacking of the P3HT. Photoluminescence spectra acquired of PCBG films heated for 4 minutes and for 1 hour show no change indicating that the presence of the reacted PCBG limits or prevents the conformational changes of the P3HT. In contrast, photoluminescence spectra of the PCBM films change shape and intensity as a result of the conformational changes of P3HT within the film.

Characterization of Photoactive Films

Films were prepared by spin coating solutions of photoactive materials onto indium tin oxide (ITO) glass substrates covered with PEDOT. The films were then subjected to an optional heat treatment. The following films were prepared:
  Film 1: P3HT/PCBG; heated for 4 minutes at 140° C.
  Film 2: P3HT/PCBG; heated for 1 hour at 140° C.
  Film 3: P3HT/PCBM; unheated Film 4: P3HT/PCBM; heated for 4 minutes at 120° C.
Film 5: P3HT/PCBM heated for 1 hour at 120° C.

The topographies of films 1-5 prepared as above were analyzed by atomic force microscopy (AFM). Referring to FIGS. 6a and 6b, the surface roughness of a PCBM:P3HT blend film increases after heating at 120° C. for 5 minutes (FIG. 6b). The units on the x- and y-axes are microns.

Figure 7B:
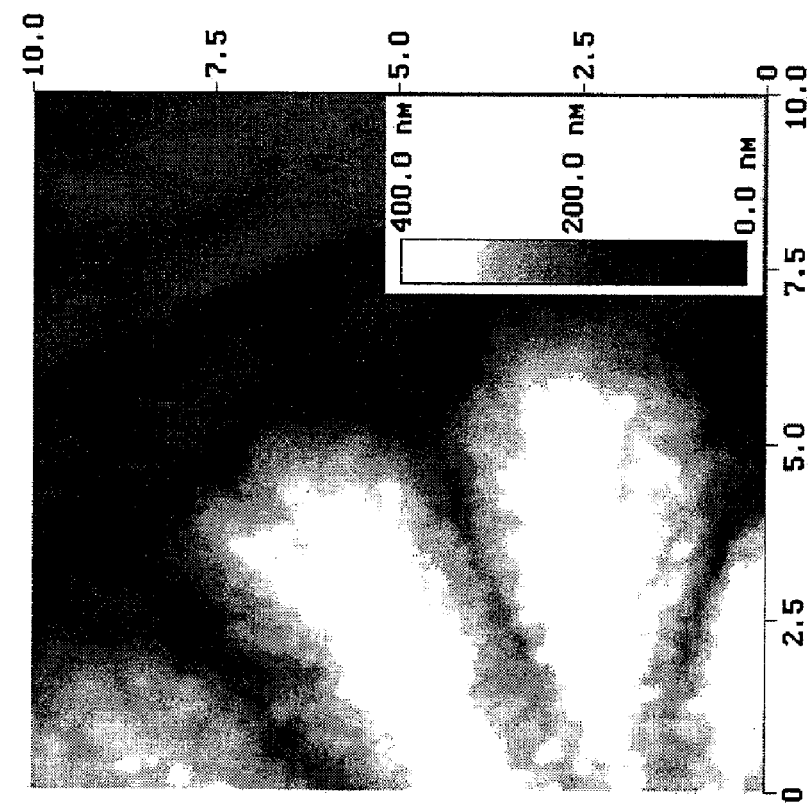
Figure 7A:
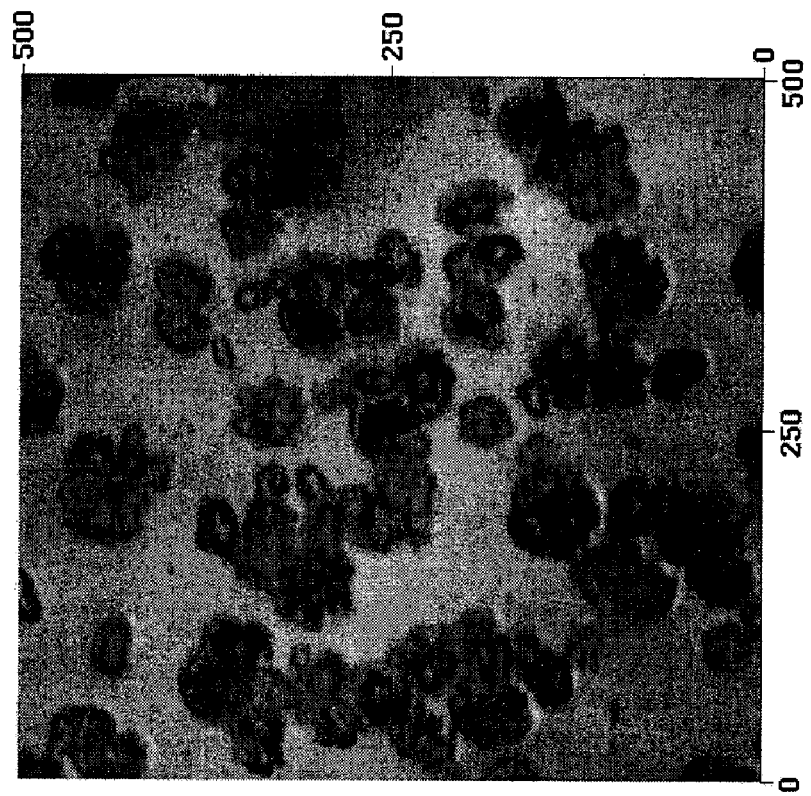
FIG. 7a is an optical image of a PCBM:P3HT film heated at 120° C. for 1 hour.

Referring to FIGS. 7a and 7b, large clusters of PCBM formed in the PCBM:P3HT film after heating at 120° C. for 1 hour. Domain formation in the uncrosslinked PCBM films will occur more slowly at room temperature but at a rate high enough to deteriorate cell performance.

Referring to FIGS. 8a and 8b, no significant change in morphology is observed in a PCBG:P3HT film heated at 140° C. 1 hour (FIG. 8b) as compared to 4 minutes (FIG. 8a). Although surface roughness of the film increases slightly, cluster formation, as it is observed in the PCBM films, does not occur. The absence of cluster (domain) formation demonstrates that covalent binding of the fullerene component stabilizes phases of electron acceptors and donors in photoactive films.

The UV-visible transmission spectra of unheated and heated P3HT/PCBM and P3HT/PCBG films were studied. Heated films of P3HT/PCBM exhibited much lower transmission at 700 nm consistent with the formation of large-size, phase separated domains. Heated films of P3HT/PCBG remain highly transparent even after one hour heating indicating little or no large phase domain formation.

Preparation of Photovoltaic Devices

Glass substrates with an ITO coating, 25×75×1.1 mm substrate, 89% transmission at 550 nm, 15-20 Ohms per sq., Thin Film Devices, Inc., Anaheim, Calif. and PET substrates with an ITO coating, LR-30 ST504-5 PET, 30 Ohms per sq., CPFilms Inc, Canoga Park, Calif. were obtained. The substrates were cut into 25×75 mm2 sizes before use. To prepare substrates for device fabrication, a small strip of the ITO coating was etched off each substrate with acid to provide a location for electrical contact to be formed between the counter electrode of a finished photovoltaic cell and an external circuit. Etching was accomplished as follows: an approximately 20×75 mm2 area of ITO was protected with removable adhesive tapes (3M). The exposed ITO (e.g., an area of about 5×75 mm) was etched off with dilute HCl/HNO3 solution. The substrates were subsequently washed with deionized H2O to remove residual acid. The tapes were removed and the substrates were washed with acetone (15 mins) and iso-propanol (15 mins) in an ultrasonic cleaner to remove residual adhesive and other impurities. The substrates were then allowed to dry in a flow of nitrogen.

A thin film including a dispersion of a conductive polymer (Baytron PH; (poly(3,4-ethylenedioxythiophene)-poly(styrenesulfonate)) was spin coated onto the etched and dried substrates, which were then dried under vacuum.

Thin films of (a) PCBG:P3HT (2:1 by weight in tetrachloroethylene) or (b) PCBM:P3HT (2:1 by weight in tetrachloroethylene) were coated onto the conductive polymer layer of respective substrates. These films were generally prepared as follows with a PCBG film as an example. A mixture of PCBG (20 mg):P3HT (10 mg) in tetrachloroethylene (1.7 g) was stirred at room temperature for 24 h and filtered through a 1 micron membrane filter. The filtered solution was spin coated onto the substrates and dried under vacuum.

The dried films were transferred to a thermal vacuum coater. Counter electrodes as thin layers of LiF (0.6 nm) and aluminum (70 nm) were evaporated on to the films through a masking grid. The completed photovoltaic devices were then released into argon and immediately sealed with adhesive tape (3M 615) in air and heated to 120° C. for 30 seconds.

As discussed below, the various properties of these photovoltaic devices were characterized.

Characterization of Photovoltaic Devices

The performance of photovoltaic devices including PCBG prepared as above was compared against the photovoltaic devices including PCBM. Current-voltage characteristics were measured with an Oriel Solar Cell I-V Testing System with a solar simulator with a 1-kW xenon lamp and filters to provide uniform light approximating the AM1.5 reference spectrum to a 15×15 cm test area. The incident light intensity was measured using an AM 1.5 calibrated single-crystal Si photodiode.

Photovoltaic devices including PCBG exhibited a slightly higher short circuit current but lower open circuit voltage. The efficiencies of both types of photovoltaic devices were comparable. Similar results were obtained for devices prepared using both glass and PET substrates.

To test the thermal stability of films, PCBM:P3HT and PCBG:P3HT films on PET/ITO/PEDOT substrates were prepared. Since phase separation is expected to be a very slow at room temperature, some of the film samples were heated at 120° C. for 2 min in air to accelerate the process so that the effect of cross-linking on cell performance can be studied. Cells were prepared of both non-heated and heated films by deposition of LiF.

While the present invention has been described with reference to certain preferred embodiments, it should be kept in mind that the scope of the present invention is not limited to these. Thus, one skilled in the art may find variations of these preferred embodiments, which, nevertheless, fall within the spirit of the present invention, the scope of which is defined by the claims set forth below.

What is claimed is:

1. A fullerene derivative, comprising a pendant cyclic ether and a fullerene comprising a number $C_j$ carbon atoms, wherein j ranges from 50 to 250 and the pendant cyclic ether and the fullerene are spaced apart by an ester group or a ketone group.

2. The fullerene derivative of claim 1, wherein the fullerene is $C_{60}$.

3. The fullerene derivative of claim 1, wherein the pendant cyclic ether comprises a cyclic group comprising a number Nc carbon atoms and a number No oxygen atoms, in which Nc is at least 2 and No is at least 1.

4. The fullerene derivative of claim 3, wherein Nc is 4 and No is 1.

5. The fullerene derivative of claim 3, wherein Nc is 3 and No is 1.

6. The fullerene derivative of claim 3, wherein No is 1.

7. The fullerene derivative of claim 1, wherein the pendant cyclic ether is cyclohexene oxide.

8. The fullerene derivative of claim 1, wherein the pendant cyclic ether is cyclopentene oxide.

9. The fullerene derivative of claim 1, wherein the pendant cyclic ether is an epoxy group.

10. The fullerene derivative of claim 1, wherein the pendant cyclic ether and the fullerene are spaced apart by at least 1 carbon atom.

11. The fullerene derivative of claim 1, wherein the pendant cyclic ether and the fullerene are spaced apart by at least 3 carbon atoms.

12. The fullerene derivative of claim 1, wherein the pendant cyclic ether and the fullerene are spaced apart by an ester group.

13. A composition, comprising a reaction product of a plurality of fullerene derivatives, each fullerene derivative comprising a pendant cyclic ether and a fullerene comprising a number $C_j$ carbon atoms, wherein j ranges from 50 to 250 and the pendant cyclic ether and the fullerene are spaced apart by an ester group or a ketone group.

14. The composition of claim 13, wherein the fullerene is $C_{60}$.

15. The composition of claim 13, wherein the reaction product comprises a plurality of ether groups.

16. The composition of claim 13, wherein the reaction product is an oligomer comprising at least two pendant fullerenes.

17. The composition of claim 13, wherein the reaction product is a polymer comprising a plurality of repeat units, each repeat unit comprising a pendant fullerene.

18. The composition of claim 13, wherein the composition further comprises a first conducting polymer.

19. The composition of claim 18, wherein the first conducting polymer comprises at least one of polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyphthalocyanines, polyvinylenes, or derivatives thereof.

20. The composition of claim 18, wherein the composition is prepared from a mixture comprising the plurality of fullerene derivatives, and the first conducting polymer or a precursor thereof.

21. The composition of claim 20, wherein the mixture further comprises a solvent.

22. The composition of claim 20, wherein the first conducting polymer or precursor thereof comprises a cyclic ether configured to react with the pendant cyclic ether of the fullerene derivatives.

23. The composition of claim 22, wherein the mixture further comprises a second conducing polymer or a precursor thereof.

24. The composition of claim 23, wherein the second conducing polymer or precursor thereof comprises a cyclic ether configured to react with the pendant cyclic ether of the first conducting polymer or precursor thereof.

25. The composition of claim 20, wherein the first conducting polymer or precursor thereof comprises at least one of thiophene, polythiophene, or a derivative thereof.

26. A device, comprising:
a composition comprising a plurality of fullerene derivatives, each fullerene derivative comprising a pendant cyclic ether and a fullerene comprising a number $C_j$ carbon atoms, wherein j ranges from 50 to 250; and
an electron donor;
wherein the device is a photovoltaic device comprising two electrodes with the composition and the electron donor between the two electrodes.

27. A device, comprising:
a reaction product of a plurality of fullerene derivatives, each fullerene derivative comprising a pendant cyclic ether and a fullerene comprising a number $C_j$ carbon atoms, wherein j ranges from 50 to 250; and
an electron donor;
wherein the device is a photovoltaic device comprising two electrodes with the reaction product and the electron donor between the two electrodes.

28. A composition, comprising:
a reaction product of a plurality of fullerene derivatives, each fullerene derivative comprising a pendant cyclic ether and a fullerene comprising a number $C_j$ carbon atoms, wherein j ranges from 50 to 250,
wherein the composition is prepared from a mixture comprising the plurality of fullerene derivatives and a conducting polymer or precursor thereof.

29. A composition, comprising:
a reaction product of a plurality of fullerene derivatives, each fullerene derivative comprising a pendant cyclic ether and a fullerene comprising a number Cj carbon atoms, wherein j ranges from 50 to 250; and
a first conducting polymer.

30. The composition of claim 29, wherein the first conducting polymer comprises at least one of polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyphthalocyanines, polyvinylenes, or derivatives thereof.

31. The composition of claim 29, wherein the composition is prepared from a mixture comprising the plurality of fullerene derivatives, and the first conducting polymer or a precursor thereof.

32. The composition of claim 31, wherein the mixture further comprises a solvent.

33. The composition of claim 31, wherein the first conducting polymer or precursor thereof comprises a cyclic ether configured to react with the pendant cyclic ether of the fullerene derivatives.

34. The composition of claim 33, wherein the mixture further comprises a second conducing polymer or a precursor thereof.

35. The composition of claim 34, wherein the second conducing polymer or precursor thereof comprises a cyclic ether configured to react with the pendant cyclic ether of the first conducting polymer or precursor thereof.

36. The composition of claim 31, wherein the first conducting polymer or precursor thereof comprises at least one of thiophene, polythiophene, or a derivative thereof.

* * * * *

UNITED STATES PATENT AND TRADEMARK OFFICE
CERTIFICATE OF CORRECTION

PATENT NO. : 7,544,747 B2
APPLICATION NO. : 11/952577
DATED : June 9, 2009
INVENTOR(S) : Russell Gaudiana Page 1 of 1

It is certified that error appears in the above-identified patent and that said Letters Patent is hereby corrected as shown below:

Column 15, Line 37, Claim 23, delete "conducing" and insert --conducting--

Column 15, Line 39-40, Claim 24, delete "conducing" and insert --conducting--

Column 16, Line 44, Claim 34, delete "conducing" and insert --conducting--

Column 16, Line 46-47, Claim 35, delete "conducing" and insert --conducting--

Signed and Sealed this

Eighteenth Day of August, 2009

David J. Kappos
*Director of the United States Patent and Trademark Office*